United States Patent
Mitchell et al.

[11] Patent Number: 6,126,428
[45] Date of Patent: Oct. 3, 2000

[54] VACUUM DISPENSE APPARATUS FOR DISPENSING AN ENCAPSULANT

[75] Inventors: Craig S. Mitchell, Santa Clara; Thomas H. Distefano, Monte Sereno, both of Calif.

[73] Assignee: Tessera, Inc., San Jose, Calif.

[21] Appl. No.: 09/227,475

[22] Filed: Jan. 8, 1999

Related U.S. Application Data

[60] Division of application No. 08/975,590, Nov. 20, 1997, Pat. No. 6,046,076, and a continuation-in-part of application No. 08/842,313, Apr. 24, 1997, which is a division of application No. 08/365,699, Dec. 29, 1994, Pat. No. 5,659,952.
[60] Provisional application No. 60/046,932, May 16, 1997.

[51] Int. Cl.⁷ .................................................. B29C 67/00
[52] U.S. Cl. ..................... 425/110; 264/272.17; 425/375
[58] Field of Search ...................... 264/272.17; 425/110, 425/116, 117, 375

[56] References Cited

U.S. PATENT DOCUMENTS

| | | | |
|---|---|---|---|
| 4,190,855 | 2/1980 | Inoue ........................................ | 257/668 |
| 4,300,153 | 11/1981 | Haykawa et al. ........................ | 257/668 |
| 4,381,602 | 5/1983 | McIver ..................................... | 29/840 |
| 4,396,936 | 8/1983 | McIver et al. ........................... | 174/252 |
| 4,711,688 | 12/1987 | Pienimaa ............................. | 264/272.17 |
| 4,816,896 | 3/1989 | Owens ..................................... | 257/671 |
| 4,881,885 | 11/1989 | Kovac et al. ........................ | 264/272.17 |
| 5,120,678 | 6/1992 | Moore et al. ............................. | 29/840 |
| 5,148,265 | 9/1992 | Khandros et al. ...................... | 257/773 |
| 5,148,266 | 9/1992 | Khandros et al. ...................... | 257/773 |
| 5,194,930 | 3/1993 | Papathomas et al. .................. | 257/773 |
| 5,203,076 | 4/1993 | Banerji et al. ............................ | 29/840 |
| 5,249,101 | 9/1993 | Frey et al. ........................... | 264/272.17 |
| 5,288,944 | 2/1994 | Bronson et al. ....................... | 174/52.4 |
| 5,385,869 | 1/1995 | Liu et al. ................................... | 29/841 |
| 5,477,611 | 12/1995 | Sweis et al. .............................. | 29/840 |
| 5,486,106 | 1/1996 | Echigo et al. ............................ | 257/783 |
| 5,518,964 | 5/1996 | DiStefano et al. ...................... | 438/113 |
| 5,563,445 | 10/1996 | Iijima et al. ............................. | 257/698 |
| 5,656,862 | 8/1997 | Papathomas et al. .................. | 257/778 |
| 5,659,952 | 8/1997 | Kovac et al. .............................. | 29/840 |
| 5,706,174 | 1/1998 | DiStefano et al. ...................... | 361/749 |
| 5,817,545 | 10/1998 | Wang et al. .............................. | 438/127 |
| 5,834,339 | 11/1998 | DiStefano et al. ...................... | 438/125 |
| 5,866,442 | 2/1999 | Brand ....................................... | 438/108 |

FOREIGN PATENT DOCUMENTS

| | | | |
|---|---|---|---|
| 2804956 | 8/1978 | Germany ........................... | 264/272.17 |
| 1-164054 | 6/1989 | Japan . | |
| 1-253926 | 10/1989 | Japan . | |
| 1-278755 | 11/1989 | Japan . | |
| 2-56941 | 2/1990 | Japan ..................................... | 156/330 |
| 2-76238 | 3/1990 | Japan ..................................... | 425/116 |
| 2-83945 | 3/1990 | Japan ............................... | 264/272.17 |
| 4-91443 | 3/1992 | Japan . | |
| 4-137641 | 5/1992 | Japan . | |

*Primary Examiner*—Robert Davis
*Attorney, Agent, or Firm*—Lerner, David, Littenberg, Krumholz & Mentlik, LLP

[57] ABSTRACT

A microelectronic assembly such as an assembly of a semiconductor chip and mounting substrate is encapsulated by applying an encapsulant to the assembly while maintaining the assembly under a subatmospheric pressure to minimize gas entrapment in the encapsulant. After the encapsulant flow around the assembly, a higher pressure is applied, causing collapse of any voids in the encapsulant. The encapsulant is then cured. The apparatus used for such encapsulation may include a chamber and a dispenser having a nozzle disposed within the chamber, and may also include a device for moving the nozzle or the assembly relative to the chamber.

9 Claims, 13 Drawing Sheets

VACUUM DISPENSE APPARATUS FOR DISPENSING AN ENCAPSULANT

CROSS-REFERENCE TO RELATED APPLICATIONS

The present application is a divisional of U.S. application Ser. No. 08/975,590, filed Nov. 20, 1997, now U.S. Pat. No. 6,046,076, which claims benefit of U.S. Provisional Application No. 60/046,932, filed May 16, 1997, and is a continuation in part of U.S. patent application Ser. No. 08/842,313, filed Apr. 24, 1997, which in turn is a divisional of U.S. patent application Ser. No. 08/365,699, filed Dec. 29, 1994, now U.S. Pat. No. 5,659,952. The disclosures of said applications and Patents are hereby incorporated by reference herein.

BACKGROUND OF THE INVENTION

In the construction of semiconductor chip package assemblies, it has been found desirable to interpose encapsulant material between and/or around elements of the semiconductor packages in an effort to reduce and/or redistribute the strain and stress on the connections between the semiconductor chip and a supporting circuitized substrate during operation of the chip, and to seal the elements against corrosion, as well as to insure intimate contact between the encapsulant, the semiconductor die and the other elements of the chip package.

Certain designs and methods heretofore have interposed encapsulant materials between semiconductor package elements. Examples of such encapsulants can be found in the aforementioned U.S. Pat. No. 5,659,952 and in the following commonly assigned U.S. patent application Ser. No. 08/610,610 filed on Mar. 7, 1996 now U.S. Pat. No. 5,834,339 and Ser. No. 08/726,697 filed on Oct. 7, 1996 now U.S. Pat. No. 5,776,796. Both of such patent applications and their complete disclosures incorporated by reference herein. A further encapsulating method and resulting package structure is shown and described in U.S. Pat. No. 5,148,266, the complete disclosure of which is also incorporated by reference herein.

Other encapsulating schemes have also been used in non-packaging areas, such as the use of a typically epoxy underfill in flip-chip (or "C4") applications to flow around the solderball connections between a semiconductor chip and a substrate. This is referred to as a non-packaging application because the finished assembly is not testable until it is attached to the substrate (such as a PWB) and underfilled; and further, because the flip chip scheme does not allow for the standardization of the electrical terminals which are attached to the substrate.

One such flip chip encapsulation scheme is described in U.S. Pat. No. 3,811,183. This patent refers to a face-down flip-chip type structure soldered to a substrate which is mechanically reinforced by introducing a liquid in the aperture between the semiconductor chip and the substrate and hardening the liquid. The disclosure explains that the drawing of the liquid through the aperture occurs through capillary action due to the small dimension of the aperture which is preferably chosen to be between 1 micron and 100 microns. Another flip chip encapsulation scheme is described in U.S. Pat. No. 5,203,076. This patent describes the need for uniform fillets on all sides of a semiconductor chip which is flip-chip bonded to a substrate because a non-symmetric fillets produce stress gradients in the resulting structure which lead to premature failures of the device. This patent states that dispensing on only two-sides of the flip chip device and relying on capillary action to "suck" a polymer underfill between the chip and the substrate incurs an excessively long cycle time (from 5 to 20 minutes) and creates the aforementioned undesired, non-uniform fillet. The patent sets forth a method to remedy this situation by sealing the entire periphery of the flip chip to the substrate with a bead of underfill material such that the sides of the flip chip make contact with the bead trapping air beneath the flip chip between the flip chip and the substrate. A vacuum chamber is then positioned over the chip, the substrate and the underfill material. Vacuum is continuously applied and entrapped air that was in the underchip area is evacuated by bubbling through the bead of underfill material. Air is then allowed into the vacuum chamber at a controlled rate which forces the underfill material into the underchip area such that there are no voids in the underfill in the underchip area. However, this method is not preferred because the violent bubbling of the entrapped air through the underfill material causes the underfill material to splatter onto adjacent surfaces. One such surface that will be almost inevitably contaminated with the underfill material is the back surface of the flip chip or semiconductor die. The splattering of the underfill material can cause time-consuming and expensive rework and cleaning of the exposed portions of the flip chip device and the adjacent surfaces of the substrate and other components. This problem is particularly severe if the splattered underfill material is not sufficiently cleaned prior to curing the underfill such that the underfill material hardens on undesired surfaces.

Thus, despite all of the effort which has been devoted to development of microelectronic encapsulation techniques (including the positive results of the aforementioned commonly owned inventions), there are unmet needs for further improvements.

SUMMARY OF THE INVENTION

One aspect of the invention provides methods of encapsulating microelectronic assemblies. A method in accordance with this aspect of the invention desirably includes the steps of applying a flowable encapsulant to the assembly while maintaining the assembly under a subatmospheric pressure, then bringing the assembly to a higher pressure above said subatmospheric pressure and holding the assembly at said higher pressure, and then curing said encapsulant. By applying the encapsulant at subatmospheric pressure, the amount of gas entrapped in the encapsulant is minimized. Moreover, when the assembly is taken to a higher pressure, any encapsulant bubble which is present is collapsed to a smaller size. Paradoxically, application of the higher pressure outside of the assembly tends to promote diffusion or other transfer of the trapped gas out of the bubble and out of the assembly through the encapsulant. Although the present invention is not limited by any theory of operation, it is believed that the smaller physical size of the encapsulant bubbles promotes release of the gas from within the bubble. Thus, the bubbles gradually disappear while the assembly is held at the higher pressure, without perceptible bubbling of the encapsulant, and without the contamination associated with violent bubbling of the encapsulant. Preferably, the assembly is held at the higher pressure for a time sufficient to substantially eliminate gas bubbles within the encapsulant. The higher pressure preferably is atmospheric pressure or a superatmospheric pressure. Where a superatmospheric pressure is employed to promote, the assembly may be brought to atmospheric pressure before completion of encapsulant curing, and typically before the beginning of encapsulant curing. The ability to cure the encapsulant at atmospheric pressure allows the use of economical atmospheric-pressure curing ovens.

The microelectronic assembly may include a microelectronic element such as a semiconductor chip overlying a substrate but spaced from the substrate so that the microelectronic element and substrate define a gap therebetween. The step of applying the encapsulant may include the step of applying the encapsulant along one or more edges of the microelectronic element so that the encapsulant flows into the gap from the edges while the assembly is under the subatmospheric pressure. The assembly may include a porous layer disposed in the gap. In this case, the encapsulant flows into the porous layer while the assembly is under the subatmospheric pressure. In a particularly preferred variant, the substrate includes a flexible dielectric film, whereas the porous layer includes a plurality of spaced-apart compliant standoffs. The encapsulant flows between the standoffs while the assembly is under the subatmospheric pressure, and the encapsulant cures to form a continuous compliant layer including the standoffs. However, the methods according to this aspect of the invention can also be used with assemblies incorporating a substantially rigid substrate such as a ceramic chip mounting or a glass-reinforced polymer circuit board. In still other processes according to the invention, the microelectronic assembly is a "glob-top" or "fill-and-dam" assembly or other assembly including a mass of encapsulant overlying components on a substrate. In these types of assemblies, the ability to eliminate gas bubbles without violent expulsion of the gas and the attendant spattering of the encapsulant helps to avoid contamination of other parts of the assembly.

The step of applying encapsulant along the edges of the microelectronic element desirably includes the step of applying the encapsulant along a plurality of edges seriatim, preferably until the encapsulant is applied along all of the edges of the microelectronic element. This may be accomplished by moving a dispensing nozzle relative to the assembly so that the dispensing nozzle traces a path around the perimeter of the microelectronic element, as by holding the microelectronic assembly in fixed position in a chamber under the subatmospheric pressure and moving the nozzle relative to the chamber. Alternatively, the nozzle may be held in fixed position relative to the chamber the assembly and the assembly can be moved relative to the chamber.

The step of maintaining the assembly at the subatmospheric pressure may include the step of maintaining the assembly in a charging gas other than air at the subatmospheric pressure. The charging gas desirably has a coefficient of diffusion in the flowable material greater than the coefficient of diffusion of air in the flowable material. This promotes even more rapid elimination of gas bubbles.

A further aspect of the invention provides a method of encapsulating a microelectronic assembly comprising the steps of providing an assembly including a semiconductor element such as a silicon chip, a substrate and an encapsulant disposed between the semiconductor element and said substrate, and directing infrared radiation through the semiconductor element so that the infrared radiation impinges on the encapsulant and promotes curing of the encapsulant. A related aspect of the invention provides a method of treating a semiconductor assembly including the step of providing a semiconductor element such as a silicon chip having first and second surfaces and a material at the second surface of the semiconductor element. The method further includes the step of directing infrared light through the semiconductor element from said first surface to said second surface so that the infrared light impinges on the material and affects the material. These aspects of the invention incorporate the realization that silicon as employed in common semiconductors is substantially transparent or translucent to infrared light, particularly within the wavelength range of about $1.2\mu$ to about $2\mu$. Thus, energy can be applied to regions of the assembly which are "buried" beneath a chip simply by applying the energy through the chip as infrared light. The infrared light may be converted to heat in the material underlying the chip, or otherwise promote curing or other desired phenomena. The infrared curing process may be used as part of the encapsulation process using subatmospheric pressure application of the encapsulant discussed above.

Still further aspects of the invention provide apparatus for encapsulating microelectronic elements. The apparatus desirably includes a chamber; a dispenser including a source of an encapsulant and a nozzle disposed within the chamber so that the dispenser can apply encapsulant to one or more semiconductor assemblies disposed within the chamber, and means such as a vacuum pump or connection to an external vacuum source for maintaining the chamber under a subatmospheric pressure while the dispenser applies encapsulant to semiconductor assemblies. The apparatus may include means for moving the nozzle relative to one or more microelectronic assemblies disposed within the chamber as discussed above. The apparatus may include means for applying a superatmospheric pressure in said chamber after application of said subatmospheric pressure. Alternatively or additionally, the apparatus may include a pressure vessel separate from the chamber, and means for applying a superatmospheric pressure in said pressure vessel and means for transferring microelectronic assemblies from said chamber to said pressure vessel. The apparatus may further include means for advancing microelectronic assemblies into the chamber and removing microelectronic assemblies from said chamber. Apparatus in accordance with this aspect of the invention can be utilized in encapsulation processes as discussed above.

DETAILED DESCRIPTION OF THE PREFERRED EMBODIMENTS

Figure 1:
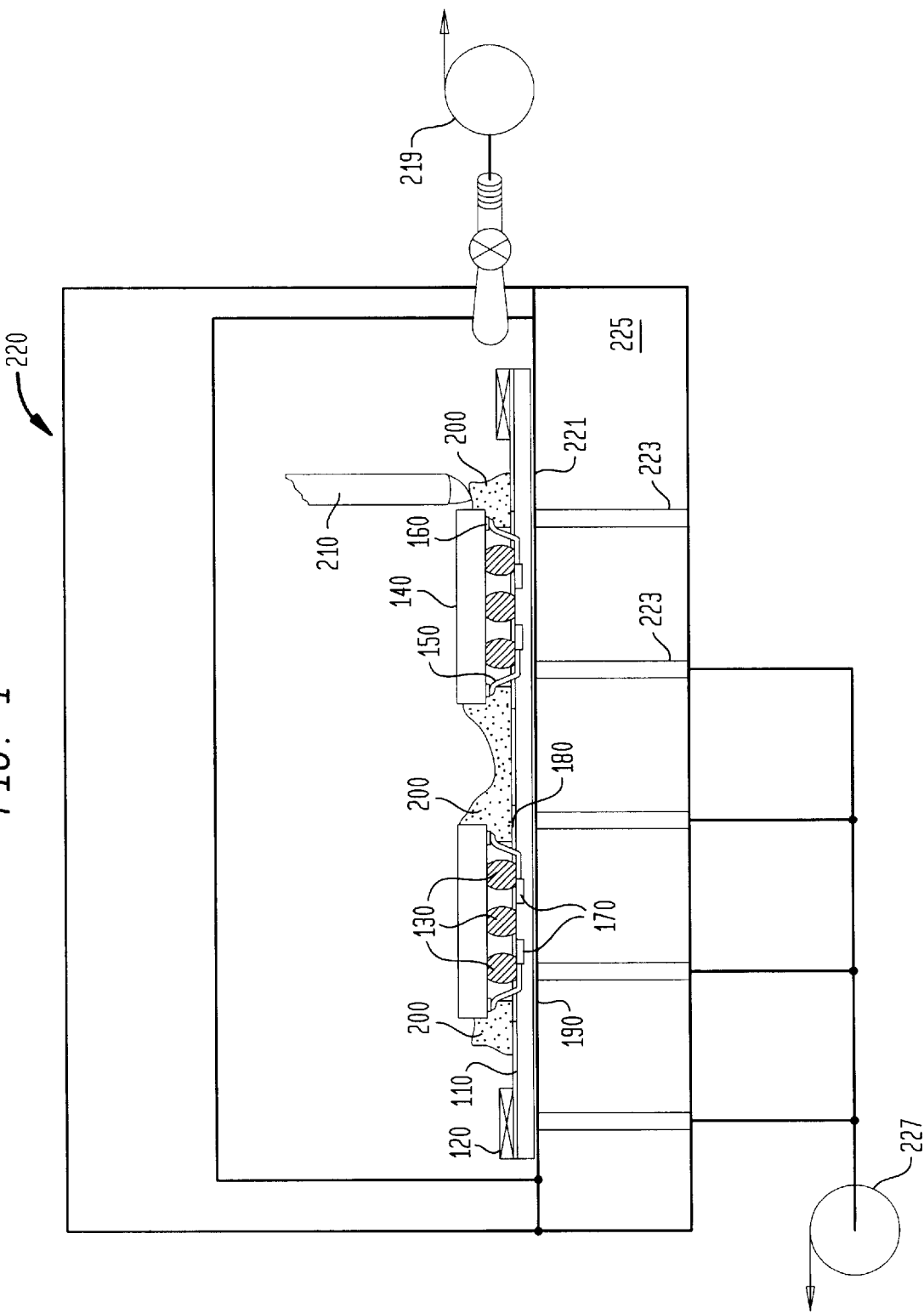
FIG. 1 is a diagrammatic sectional view of apparatus in accordance with one embodiment of the invention in conjunction with microelectronic assemblies at one stage in a process according to an embodiment of the invention.

FIG. 1 shows a side view of a semiconductor chip package assembly 100. A flexible, substantially inextensible film, such as polyimide 110, is attached to a frame 120 such that the film is held in a somewhat taut configuration. Typically, a plurality of compliant stand-offs 130 are applied or deposited on future chip attachment sites. Examples of materials for compliant stand-offs may include silicones, flexibilized epoxies, fluropolymers, gels, foams etc. A chip 140 is attached or adhered to each such desired attachment site such that the compliant stand-offs are disposed between the opposing surfaces of film 110 and chip 140. Flexible, electrically conductive leads 150 are then bonded to respective chip contacts 160 such that the leads electrically connect the chip contacts 160 to respective terminals 170 on the opposite surface of the film 110. Typically, the leads 150 are so bonded through the use of an ultrasonic or thermosonic bonding tool through apertures 180 in the film, as described in more fully in commonly assigned U.S. Pat. Nos. 5,398,863, 5,489,749; and 5,536,909 and similar methods and structures. The apertures 180 are next covered (such as with a solder mask or coverlay 190) so that the subsequent step of depositing encapsulant does not cause the encapsulant to flow through the apertures and get on the opposite surface of the substrate 110, such that it could contaminate the terminals 170 or be aesthetically unpleasing.

The aforementioned assembly is then placed in a vacuum chamber 220 and vacuum is applied by a vacuum pump 219 or other conventional device for creating a subatmospheric pressure. Preferably, the subatmospheric pressure within chamber 220 is about 200 millTorr or less; lower subatmospheric pressures (stronger vacuum) reduces gas entrapment in the encapsulant, as discussed below. After the application of a vacuum, and while the vacuum is maintained, an encapsulant 200 is dispensed around several sides of the periphery of the chip using a dispensing needle 210 connected to a source of encapsulant (not shown). Assuming a rectangular chip 140, typically, the encapsulant is applied on at least three of the four sides, if not all four sides. Since the encapsulant is dispensed in a vacuum, the dispensing needle and the alignment and movement means therefor must also be located within the vacuum chamber 220, as described in more detail below. Alternately, the entire dispensing machine could be located within the chamber 220, however, this is not as preferred since it could lead to contaminants entering into the process. Preferably, a vacuum is also applied to the substrate/coverlay combination by a vacuum chuck in the base 225 of the chamber 220 to ensure that the parts remain correctly aligned during the dispensing operation and to prevent warpage of the substrate/coverlay. The vacuum chuck has a holding surface 221 and a set of passages 223 extending to the holding surface. These passages are connected to a vacuum source 227 which is adapted to maintain a higher vacuum than the vacuum within chamber 220. Thus, the subatmospheric pressure at surface 221 is less than the pressure prevailing within chamber 220. As an alternative to the vacuum chuck, or in addition thereto, mechanical clamping devices may be applied to grasp frame 120 or the assembly itself.

The vacuum environment and the wetting of the encapsulant to the stand-offs 130 and the opposing chip and substrate surfaces causes the encapsulant 200 to flow under the chip between the chip and the substrate by capillary action. This occurs relatively quickly, but this time period is somewhat dependent on the overall size of the chip 140. Instead of attempting to address the issue of trapped air underneath the die and/or in the encapsulant after dispense, the intention is to remove most and preferably all of the air in and around the assembly prior to dispense. By doing this, the encapsulant will more readily flow underneath the die, encapsulating the compliant stand-offs 130, leads 150 and chip/substrate surfaces. At some point, the encapsulant 200 wicks in and comes to a steady state. The chamber 220 is then pressurized in a controlled manner such that it returns to at least atmospheric pressure if not a greater pressure. Upon pressurization, the encapsulant wave front rushes forth typically creating a small void in or around the center of the assembly between the chip 140 and the substrate 110. This void can be due to residual gasses left within the chamber or to gases dissolved in the encapsulant material itself which subsequently "out-gas" and cause a localized pressure zone. To minimize release of dissolved gases during the encapsulation process, the encapsulant may be degassed prior to the encapsulating step, as by holding the liquid encapsulant under vacuum in a separate tank until dissolved gases are removed. The void left in the assembly later collapses upon itself as the residual gasses diffuse through the encapsulant in a controlled manner, such that no blurping effect occurs. After a suitable holding time sufficient to eliminate voids or reduce their size to such a level that they do not pose a problem in further use of the assembly, the encapsulant is then cured by a suitable mechanism, such as the application of heat. The holding time required for diffusion to complete collapse of the voids can be determined by calculation based on knowledge of the residual gas that is present, the diffusion rate of the residual gas and the physical dimensions of the parts. Alternatively, the time required for diffusion sufficient to eliminate voids entirely, or to reduce the size of any voids to a level which does not pose a problem in subsequent use of the parts, can be determined by simply processing a few parts with longer and shorter holding times prior to cure of the encapsulant. The cured encapsulant is preferably a compliant material, such as a silicone or flexiblized epoxy, etc. After the curing step, solder balls are attached to the terminals 170 and the individual semiconductor packages are separated (or "diced") from the substrate/frame so that they can be tested and subsequently attached to contacts on a printed wiring board ("PWB").

Figure 2A:
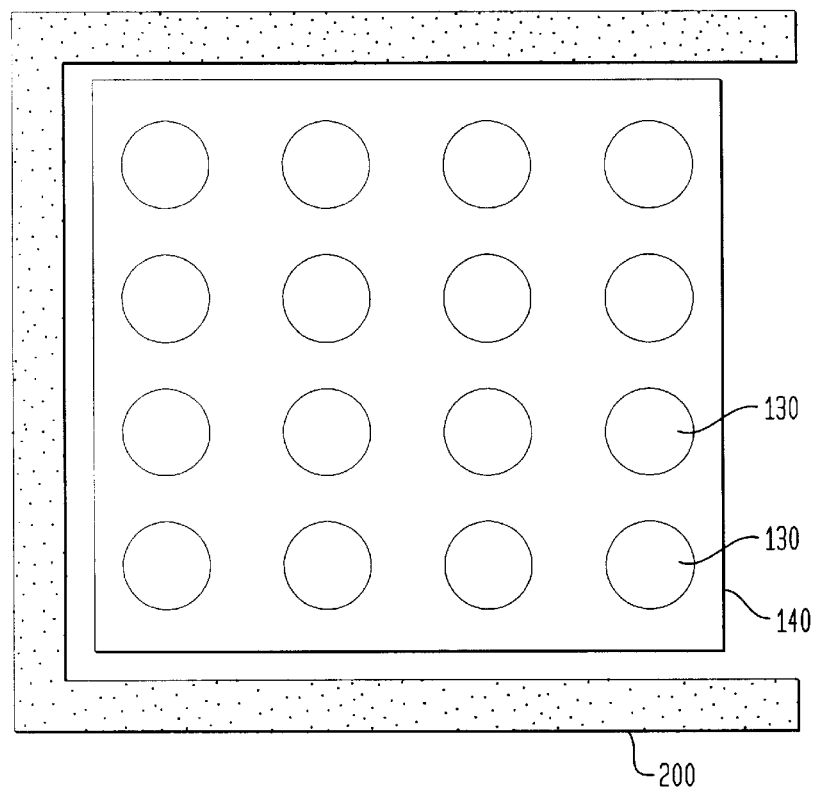
FIGS. 2A through 2D are fragmentary diagrammatic sectional views depicting portions of an assembly at successive stages in the process of FIG. 1.
Figure 2B:
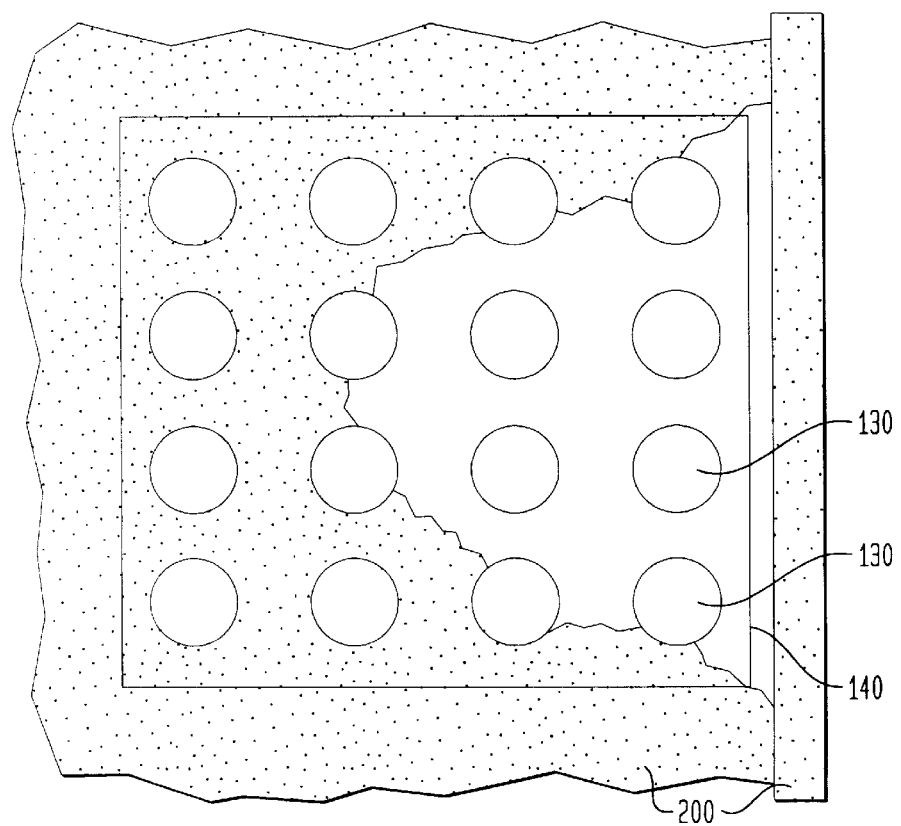
Figure 2C:
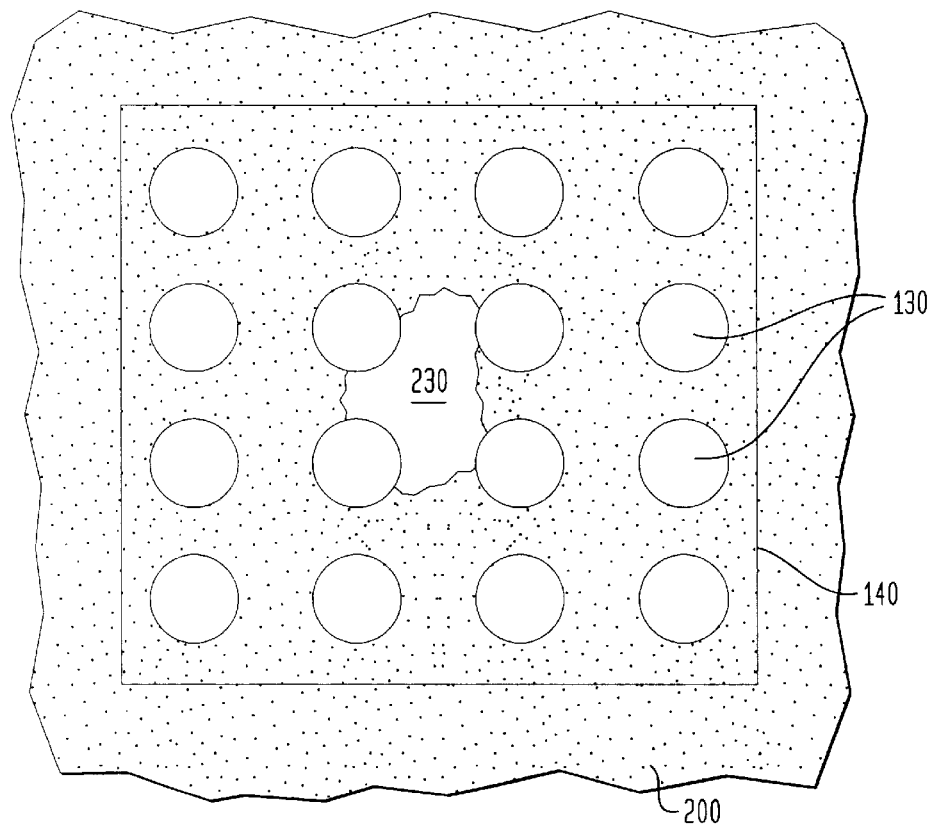
Figure 2D:
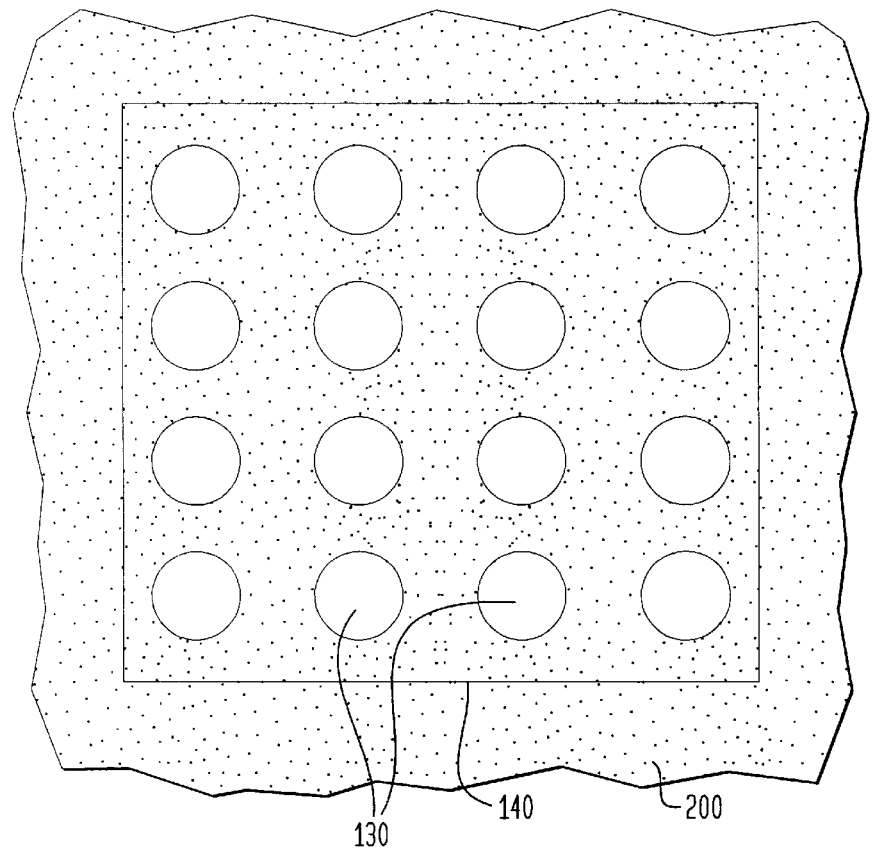

FIG. 2A shows a top view looking through the chip 140 of one stage in the process. In FIGS. 2A–2D, chip 140 is shown as a clear element so that the encapsulant flowing beneath the chip can be seen. The method depicted in FIGS. 2A–2D is an initial three side dispense method wherein the dispensing needle 210 dispenses encapsulant 200 on three sides of the periphery of the chip 140 after vacuum has been applied. Thus, the dispensing needle traces a path along these three sides in sequence. The encapsulant 200 is allowed to flow between the chip 140 and the substrate 180 by capillary action, as discussed above. Encapsulant is then dispensed on the fourth side of the chip 140, as shown in FIG. 2B. The new encapsulant deposited on the fourth side of the chip 140 is next allowed to flow under the chip such that the entire periphery of the chip 140 is sealed to the film or substrate 110 by the encapsulant 200. As described earlier, the chamber 220 is then pressurized in a controlled manner such that it returns to atmospheric pressure. Upon pressurization, the encapsulant wave front rushes forth creating a smaller void 230 (FIG. 2C) typically containing residual gas (either left in the chamber or outgased from the encapsulant material.) Over time, this small void collapses due to the greater pressure in the chamber and the residual gasses diffuse through the encapsulant in a controlled manner, such that no blurping effect occurs. In this condition, the encapsulant and the standoffs 130 form a continuous void-free layer filling the entire space between chip 140 and the film or substrate as shown in FIG. 2D. During the pressurization step, a gas may be injected into the chamber to raise the pressure in the chamber to a point greater than atmospheric pressure.

Figure 3A:
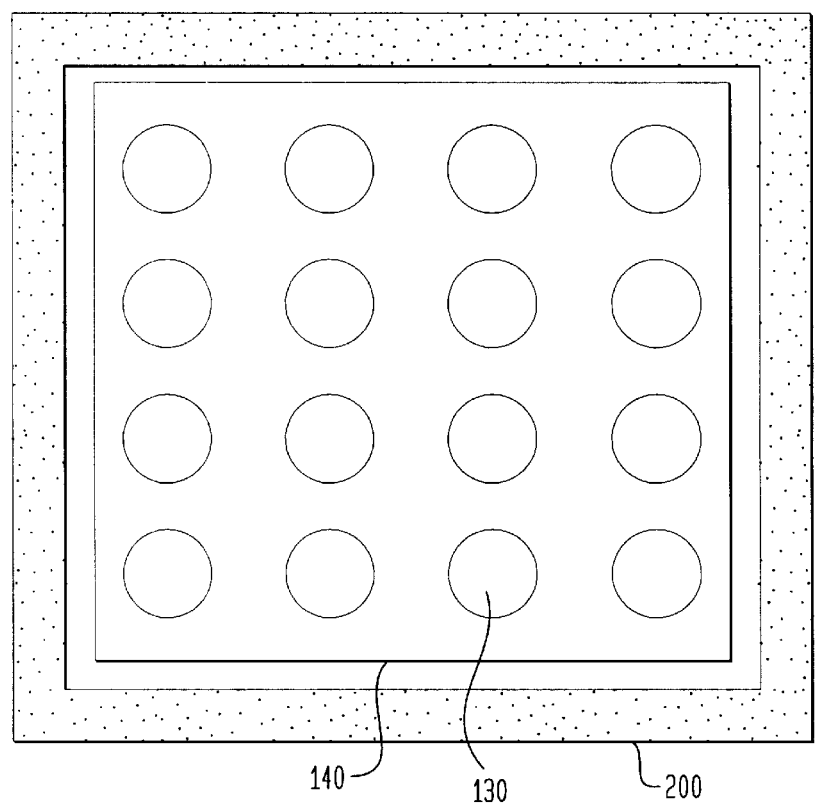
FIGS. 3A through 3C are views similar to FIGS. 2A–2D but depicting a process according to a further embodiment of the invention.
Figure 3B:
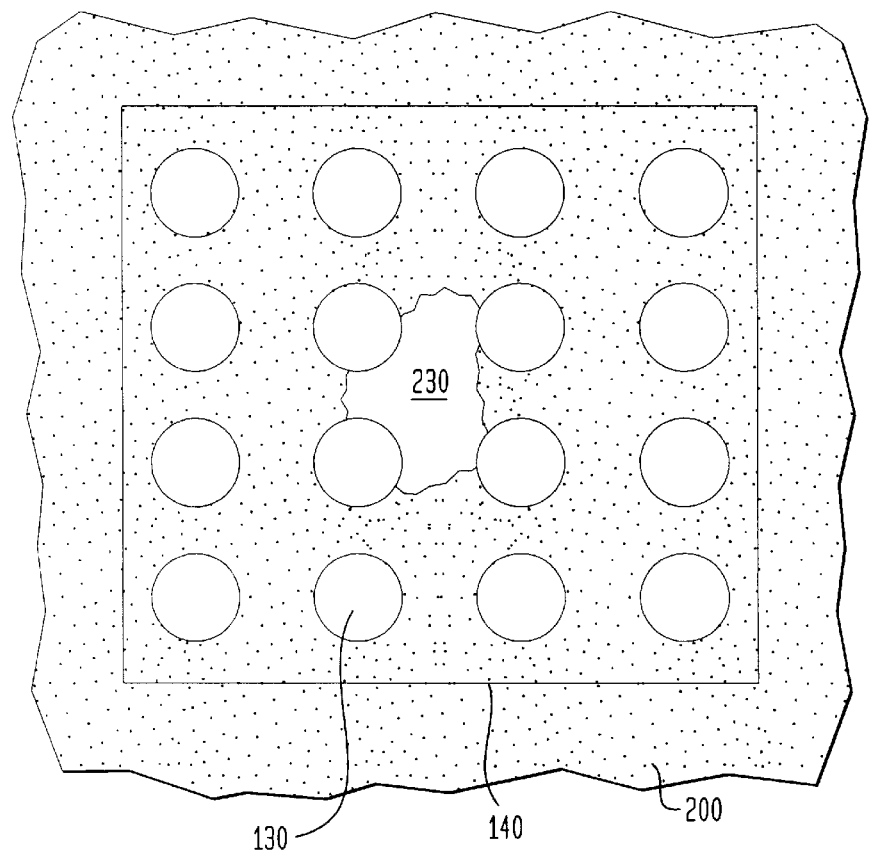
Figure 3C:
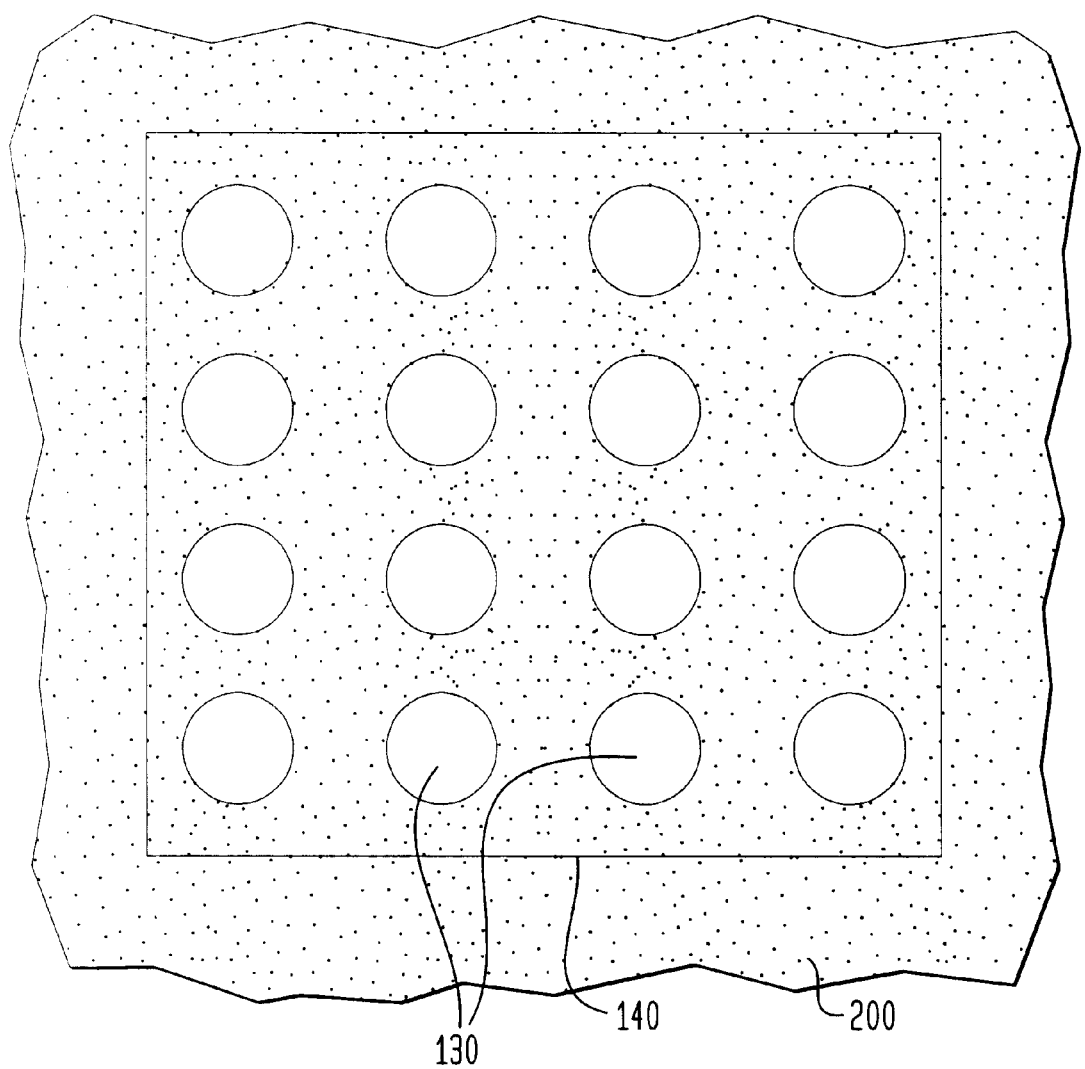

FIGS. 3A–C show a top view (looking through the chip 140) of an initial four side dispense method wherein the dispensing needle 210 dispenses encapsulant 200 on four sides of the periphery of the chip 140 after vacuum has been applied. Typically, in this configuration, the encapsulant 200 is dispensed such that there is a gap between the sides of the chip 140 and the encapsulant 200. This allows most of the residual gas to escape prior to the encapsulant flowing beneath the chip. The rest of the process follow the above described three sided process.

In a variant of the process, the chamber is purged and charged with a gas ("charge gas") that is known to diffuse quickly and easily through the encapsulant 200, and then evacuated before the encapsulant is displaced. Thus, after the encapsulant flows beneath the chip and seals the periphery of the chip, any gas which remains as in void within the encapsulant will be composed of the charge gas. The charge gas will diffuse through the encapsulant as pressure in the chamber 220 is applied by admitting a pressurization gas to the chamber. The pressurization gas may be supplied by releasing the vacuum to admit atmospheric air as a pressurization gas or by admitting the pressurization gas (air or other known gas) from a source other than the atmosphere. The pressurization gas should preferably be a gas which is known not to diffuse as easily in the encapsulant 200 as the charge gas originally charged into the chamber 220. Thus, the charge gas will diffuse out of any void faster than the pressurization gas will diffuse into the void. A table of gas permeability though silicone rubber is set forth below as Table I.

TABLE I

| GAS | PERMEABILITY | GAS | PERMEABILITY |
|---|---|---|---|
| $H_2$ | 65 | $C_2H_4$ | 135 |
| He | 35 | $C_2H_2$ | 2640 |
| $NH_3$ | 590 | $C_2H_6$ | 250 |
| $H_2O$ | 3600 | n-$C_4H_{10}$ | 900 |
| CO | 34 | n-$C_5H_{12}$ | 2000 |
| $N_2$ | 28 | $CH_4$ | 95 |
| NO | 60 | n-$C_{10}H_{22}$ | 430 |
| $O_2$ | 60 | Toluene | 913 |
| $H_2S$ | 1000 | HCHO | 1110 |
| Ar | 60 | MeOH | 1390 |
| $CO_2$ | 325 | $COCl_2$ | 1500 |
| $N_2O$ | 435 | Acetone | 586 |
| $NO_2$ | 760 | Pyridine | 1910 |
| $SO_2$ | 1500 | Benzone | 1080 |
| $CS_2$ | 9000 | Phenol | 2100 |

Diffusion of gas from within a void, and hence collapse of the void, may continue while the assembly is held in normal room atmospheric conditions after removal from the chamber and before cure. In this regard, although the present invention is not limited by any theory of operation, it is believed that the surface tension of the liquid encapsulant surrounding the void tends to increase the pressure within the void and thereby promote diffusion of gas from the void to the surrounding atmosphere. Also, where the gas within the void is composed of a charge gas having diffusivity through the encapsulant higher the diffusivity of air through the encapsulant, the greater diffusivity of the charge gas will promote continued collapse of the void.

Figure 4A:
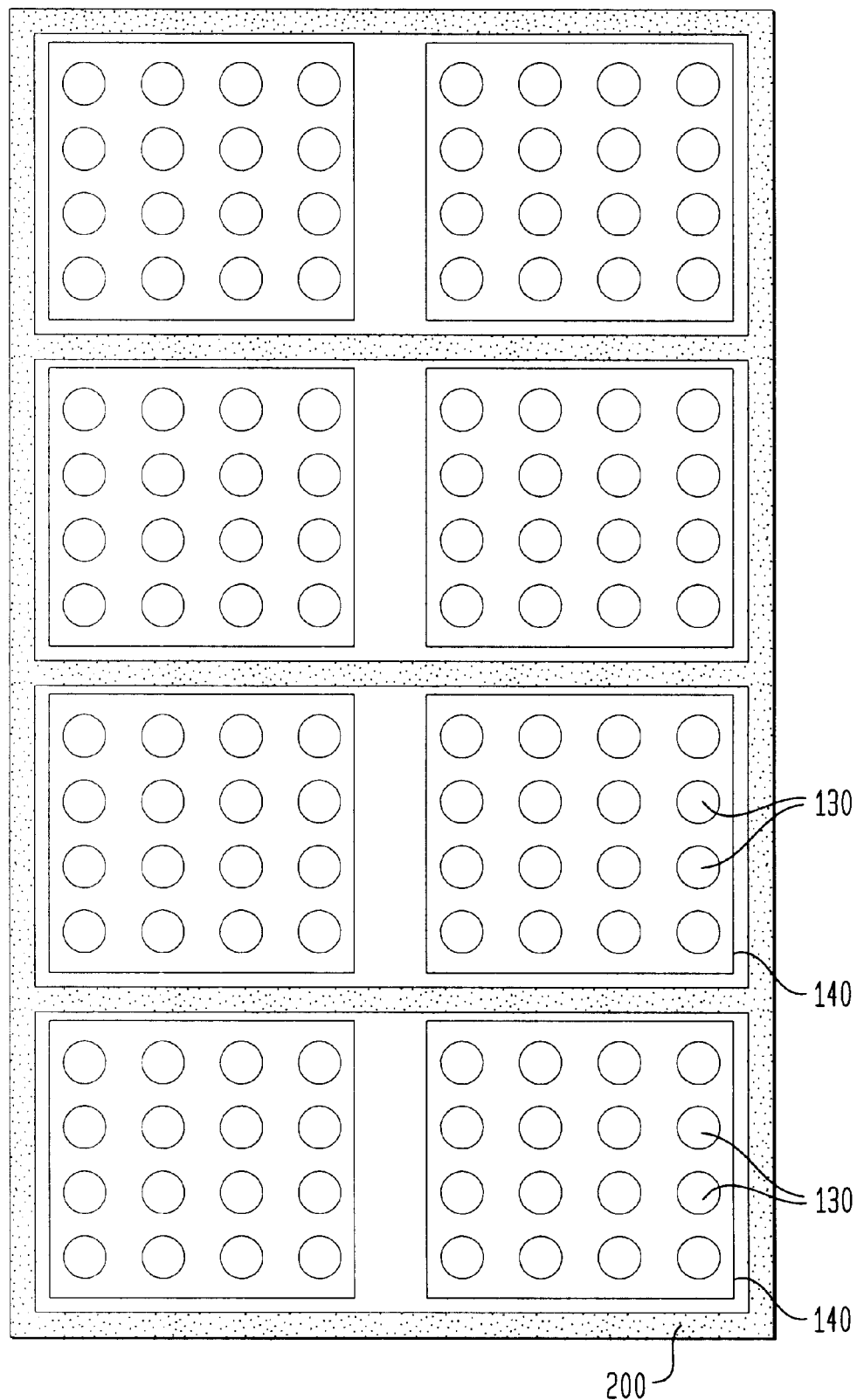
FIGS. 4A through 4D are additional views similar to FIGS. 2A–2D but depicting a process according to yet another embodiment of the invention.
Figure 4B:
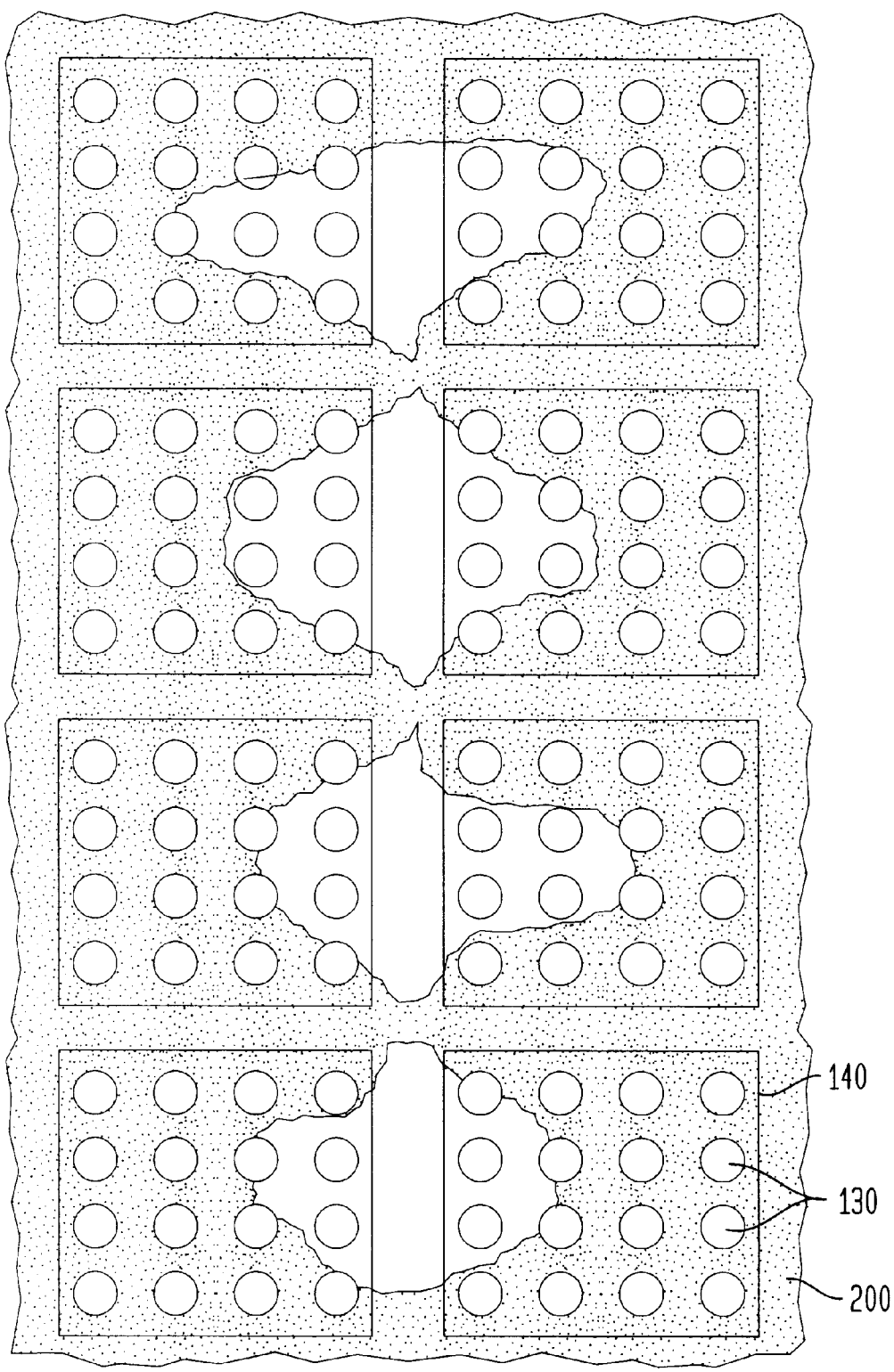
Figure 4C:
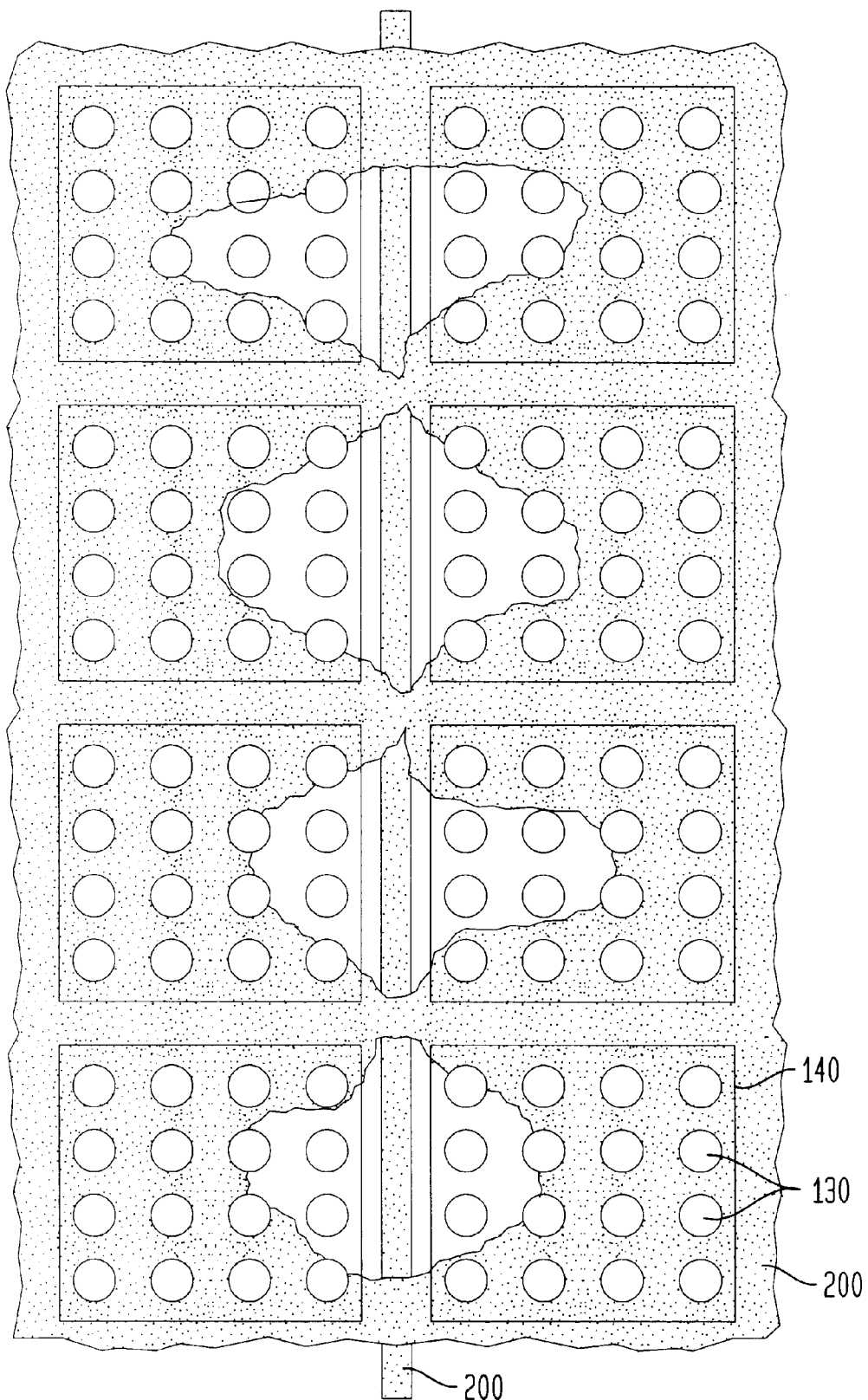
Figure 4D:
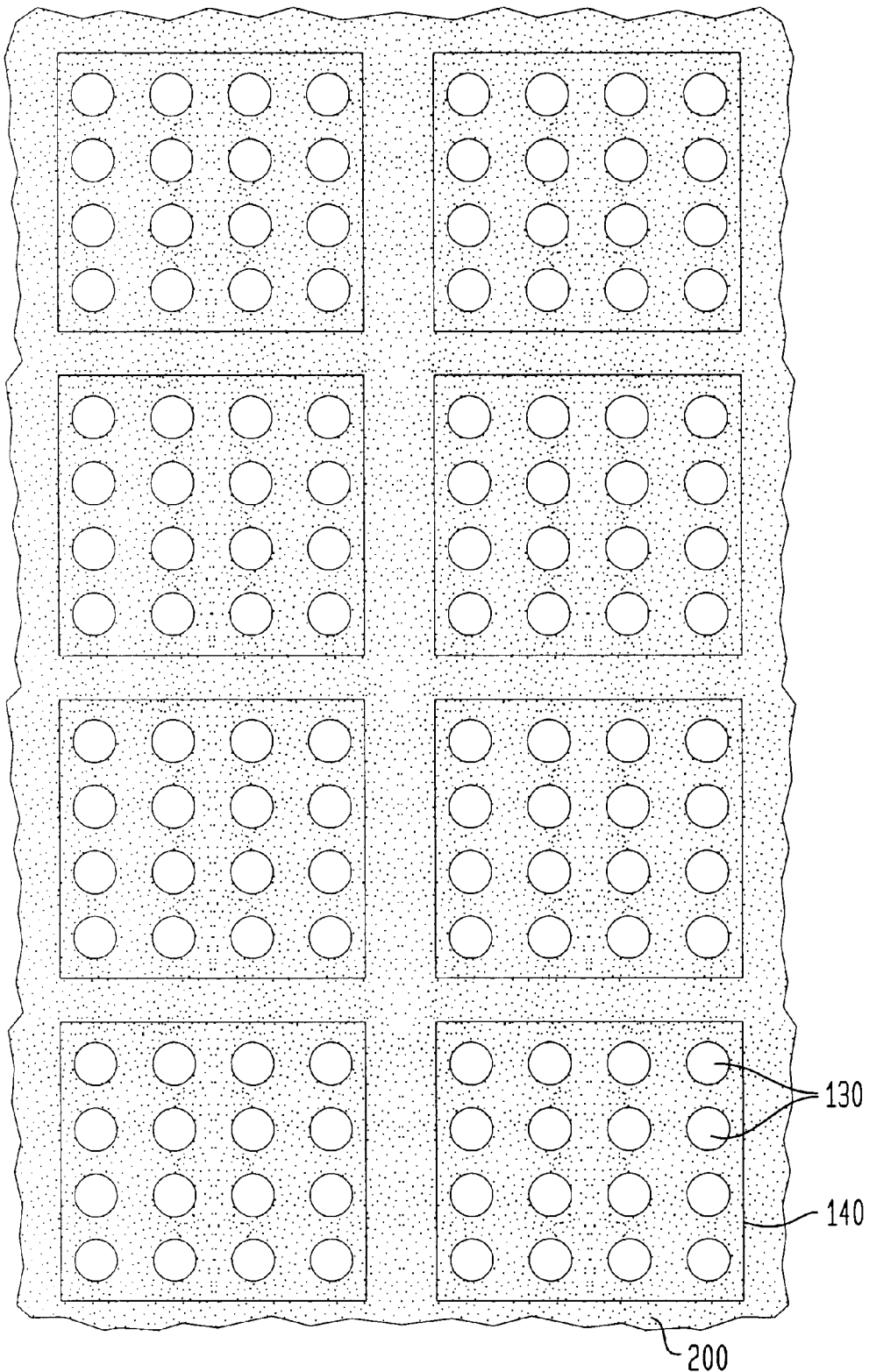

In a further embodiment, a plurality of chips 140 in an array are encapsulated simultaneously using the three sided technique described earlier with regard to FIGS. 2A–D. As shown in FIG. 4A, encapsulant 200 is dispensed on the periphery of the plurality of chips 140 and is further dispensed between adjacent pairs of chips in a first direction. Capillary action allows the encapsulant 200 to flow beneath the chips 140 (FIG. 4B). The encapsulant is then dispensed in a second direction between adjacent pairs of chips 140 (FIG. 4C). The chamber is then pressurized such that any residual gas is diffused through the encapsulant 200 in a controlled manner.

Figure 5:
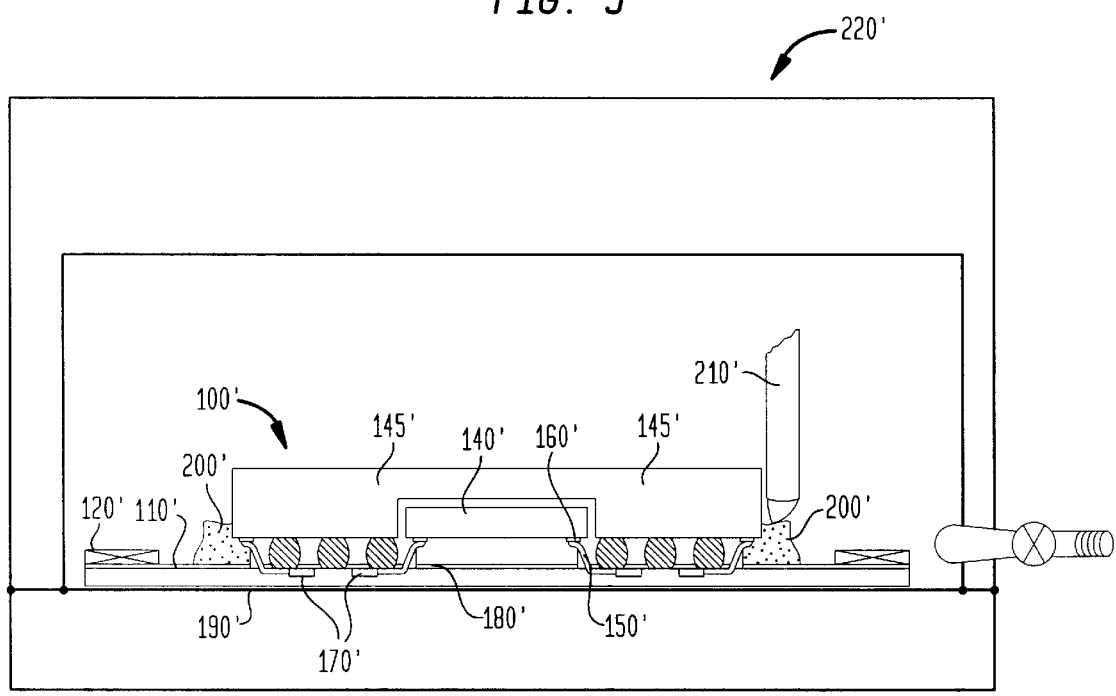
FIG. 5 is a further diagrammatic sectional view depicting apparatus and a stage of a process according to further embodiments of the invention.

FIGS. 1–4 disclose so called "fan-in"0 embodiments in which the terminals 170 reside beneath the periphery of the chip 140 itself. However, so called fan-out and fan-in/fan-out packages can also be encapsulated using this method. Examples of such package types can be found in commonly assigned U.S. Pat. No. 5,148,265 and U.S. patent application Ser. No. 08/365,749 filed on Dec. 29, 1994 now U.S. Pat. No. 5,929,517, the complete disclosures of both of which are hereby incorporated by referenced herein. FIG. 5 shows a side view of a fan-out semiconductor chip package assembly 100'. A flexible, substantially inextensible substrate or film, such as polyimide 110', is attached to a frame 120' such that the film is held in a somewhat taut configuration. Typically, a plurality of compliant stand-offs 130' are applied or deposited on attachment sites on film 110'. These stand-offs may be similar to those discussed above, except that that the stand-offs at each attachment site on film 110' are arranged to engage larger assemblies as discussed below, rather than to engage the chips themselves. Examples of materials for compliant stand-offs may include silicones, flexibilized epoxies, fluropolymers, gels, foams etc. An assembly including a chip 140' and a packaging element such as a heat spreader, can or ring encircles the periphery of the chip 140', is engaged with the stand-offs 130' at attached or adhered to the desired attachment site such that the compliant stand-offs 130' are disposed between the opposing surfaces of the assembly and of substrate or film 110'. In the particular arrangement illustrated, the stand-offs are engaged between the packaging element or can 145' and the film 110'. The assembly may be provided preassembled and may be engaged as a unit with the stand-offs and film 110'. Alternatively, the elements of such an assembly may be placed individually on film 110', so that the assembly is formed in place on the film. Flexible, electrically conductive leads 150' are then bonded to respective chip contacts 160' such that the leads electrically connect the chip contacts 160' to respective terminals 170' on the opposite surface of the film 110'. Typically, the leads 150' are so bonded through the use of an ultrasonic or thermosonic bonding tool through apertures 180' in the film, as described above. The apertures 180' are next covered (such as with a solder mask or coverlay 190') so that the subsequent step of depositing encapsulant does not cause the encapsulant to flow through the apertures and get on the opposite surface of the substrate 110', such that it could contaminate the terminals 170' or be aesthetically unpleasing.

The aforementioned assembly is then placed in a vacuum chamber 220' and vacuum is applied. After the application of a vacuum, an encapsulant 200' is dispensed around several sides of the periphery of the assembly using a dispensing needle 210'. Assuming a rectangular heat spreader or can 145', typically, the encapsulant is applied on at least three of the four sides, if not all four sides of the can 145'. The remainder of the process is essentially the same as that described above; a substantially void-free layer is formed between the chip and can assembly and film 110' in the same manner as a void free layer is formed between the chip and film in the processes discussed above with reference to FIGS. 1–4. Since the encapsulant is dispensed in a vacuum, the dispensing needle and the alignment and movement means therefor must also be located within the vacuum chamber 220', as described in more detail below. Alternately, the entire dispensing machine could be located within the chamber 220', however, this is not as preferred since it could lead to contaminates entering into the process.

The vacuum environment and the wetting of the encapsulant to the stand-offs 130' and the opposing chip and substrate surfaces causes the encapsulant 200' to flow between the assembly and the substrate by capillary action. This occurs relatively quickly, but this time period is somewhat dependent on the overall size of the heat spreader/chip assembly. Instead of attempting to address the issue of trapped air underneath the die and/or in the encapsulant after dispense, the intention is to remove most and preferably all of the air in and around the assembly prior to dispense. By doing this, the encapsulant will more readily flow underneath the assembly, encapsulating the compliant stand-offs 130', leads 150' and chip/substrate surfaces. At some point, the encapsulant 200' wicks in and comes to a steady state. The chamber 220' is then pressurized in a controlled manner such that it returns to at least atmospheric pressure if not a greater pressure. Upon pressurization, the encapsulant wave front rushes forth typically creating a void in or around the center of the assembly between the chip 140' and the substrate 110'. This void can be due to residual gasses left within the chamber or to gases dissolved in the encapsulant material itself which subsequently "out-gas" and cause a localized pressure zone. This void, with time, collapses upon itself as the residual gasses diffuse through the encapsulant in a controlled manner, such that no blurping effect occurs. The time of such diffusion can be determined by knowing the residual gas that is present and the diffusion rate of the residual gas. The encapsulant is then cured by a suitable mechanism, such as the application of heat. The cured encapsulant is preferably a compliant material, such as a silicone or flexiblized epoxy, etc. After the curing step, solder balls are attached to the terminals 170' and the individual semiconductor packages are separated (or "diced") from the substrate/frame so that they can be tested and subsequently attached to contacts on a printed wiring board ("PWB"). Again, these stages of the process may be performed in the same manner as those discussed above.

Similar processes can be used with assemblies other than the simple chip/can assembly shown in FIG. 5, and with microelectronic elements other than semiconductor chips or assemblies.

Figure 6:
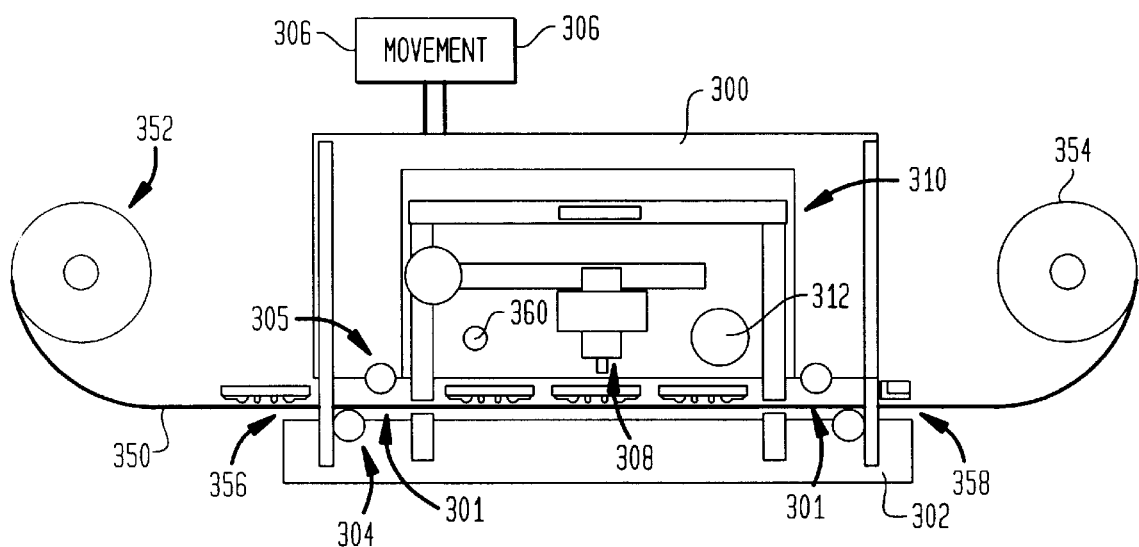
FIG. 6 is a further diagrammatic view depicting apparatus and a stage of a process according to yet another embodiment of the invention.

Up to this point, discrete frames carrying a plurality of semiconductor chips/packages have been discussed. FIG. 6 shows one apparatus and process which apply the above inventive methods using a reel-to-reel configuration. In such a configuration, a plurality of chips are attached to a continuous roll 352 of flexible tape or film 350, such as the flexible polyimide discussed above, using compliant stand-offs between each chip and the film as discussed above. Preferably, the chips are assembled to the tape so as to provide groups of chips, each such group including a few chips disposed close to one another along the length of the tape, and a larger space or "pagination" 301 between each pair of adjacent groups. Where the tape is provided with the compliant standoffs, the standoffs may be disposed in such a pattern. The dispensing machine includes a vacuum chamber having a top portion 300 and a bottom portion 302 movable towards and away from one another. Resilient seals in the form of O-rings 304 and 305 are provided on both portions. A movement device 306 is linked to the top portion for moving the top portion towards and away from the bottom portion. Thus, the top and bottom portions can be moved between the open position depicted in FIG. 6 and a closed position in which the portions are sealed to one another by O-rings 304 and 305. A dispense head 308 is supported for movement within the chamber defined between portions 300 and 302. The dispense head desirably is movable in three orthogonal directions by a conventional mechanical, electrical, fluid-powered or other actuator 310 disposed in the chamber. The actuator may be supported on either portion 300 or 302 of the chamber.

In a process according to a further embodiment of the invention, the apparatus is actuated cyclically. Each cycle begins with a feed stage. In this stage, portions 300 and 302 of the chamber are held in the open position as shown in FIG. 6. The tape is advanced stepwise, from supply roll 352 to a takeup roll 354, one step per cycle. The stepwise movement takes the tape through the chamber so that a part of the tape enters the chamber through a predetermined location or "inlet port" 356 between portions 300 and 302, whereas the part of the tape previously located in the chamber moves out of the chamber through another location or "outlet port" 358. The stepwise advance of the tape is selected so that after each feed cycle, one or more groups of chips are disposed within a central dispensing region of the machine, inside the chamber, within the range of motion of dispense head 308. Other groups of chips are beyond the dispensing area and safe from any areas in the machine which could cause harm to them during a dispense operation. In this position of the tape, a pagination 301 is aligned with the O-rings 304 and 305 at the inlet port, whereas another pagination is aligned with the O-rings at the outlet port.

After the feed stage, the chamber portions are closed. The O-rings seal the chamber portions to one another, and also form seals around the tape at the inlet port and the outlet port. A vacuum is the applied within the chamber through a vacuum port 312 prior to the dispense operation. The vacuum port is connected to a conventional vacuum source (not shown) such as a vacuum pump. Also, the tape may be clamped in position on lower portion 302, as by applying a vacuum through holes (not shown) in the lower portion, to suck the tape down onto the lower portion. This maintains the tape in proper alignment. Other clamping arrangements can be utilized. For example, all or part of the lower portion 302 may be vertically movable. Upward movement of the lower portion may engage the tape with a fixed clamp (not shown).

Prior to application of the vacuum, the interior of the chamber optionally may be purged with a charge gas as discussed above. The dispensing step is then performed under vacuum as described above. The dispense head can move in a full three dimensional range of motion through the use of an X axis mechanism, a Y axis mechanism, and a Z axis mechanism incorporated in actuator 310. In a preferred embodiment, the dispense head/needle can therefore be programmed to follow a desired path around the periphery of the chips at a desired height off of the tape while dispensing the encapsulant. After dispensing, the encapsulant flows under the chips by capillary action between the chip and the substrate and wets the surfaces of the elements therebetween, as described earlier. A bleed port 360 is then used to apply pressure after the encapsulant has sealed the periphery of each chip. This same port or an additional port could be used to supply the charge gas.

After the parts are fully encapsulated, the cycle repeats. The next group of chips is indexed into the central dispensing region while the encapsulated parts are simultaneously indexed into another region of the machine which cures the encapsulant using a suitable method, such as heating the packages in a convection oven or pressure oven.

Numerous variations of the features discussed above can be employed. For example, instead of making the chamber portions 300 and 302 movable relative to one another, the chamber can be provided with a fixed wall structure equipped with movable gates at the inlet port and outlet port. These gates preferably would be provided with resilient seals so as to seal around the tape.

Apparatus in accordance with a further embodiment of the invention includes a vacuum chamber 400 (FIG. 7) which has a single access port 402 equipped with a movable door 404 and equipped with appropriate seals (not shown). The vacuum chamber is connected to a vacuum source such as a pump 408 or other conventional vacuum source and to a source 410 containing a charging gas as discussed above. The vacuum source and charge gas source desirably are equipped with conventional regulating and control devices (not shown) for controlling the pressures applied in the chamber. Chamber 400 is equipped with an encapsulant dispensing nozzle 412 connected to an encapsulant source 414. This nozzle 412 is movable in a vertical direction within chamber 400, between the extended position illustrated in FIG. 6 and a retracted position in which the nozzle is elevated upwardly, towards the top of the chamber. A lifting device such as a pneumatic cylinder or other conventional mechanical actuator 416 is physically connected to the nozzle for moving it between the extended and retracted positions. As depicted, the lifting device is physically located outside of the chamber. However, portions or all of the lifting device may be disposed inside of chamber 400. Appropriate seals are provided around all moving parts penetrating the walls of the chamber to prevent leakage of gases into or out of the chamber.

Chamber 400 is also equipped with a movable stage 418 and an actuator 420 for moving the stage in a first horizontal direction, to the right and left as seen in FIG. 6, and in a second horizontal direction, into and out of the plane of the drawing as seen in FIG. 6. Any conventional mechanical, electrical, fluid-powered or other actuator may be used. Stage 418 is equipped with a selectively actuatable mechanical clamp 422. Clamp 422 is adapted to hold a frame 424 similar to the frame 120 discussed above. As discussed above, each frame 424 holds assemblies including a substrate or film 426 with microelectronic devices 428 thereon. As in the embodiments discussed above, the microelectronic devices are elevated above the substrate, as by standoffs (not shown) disposed between the devices and substrate, so that the device and substrate define a gap therebetween.

Figure 7:
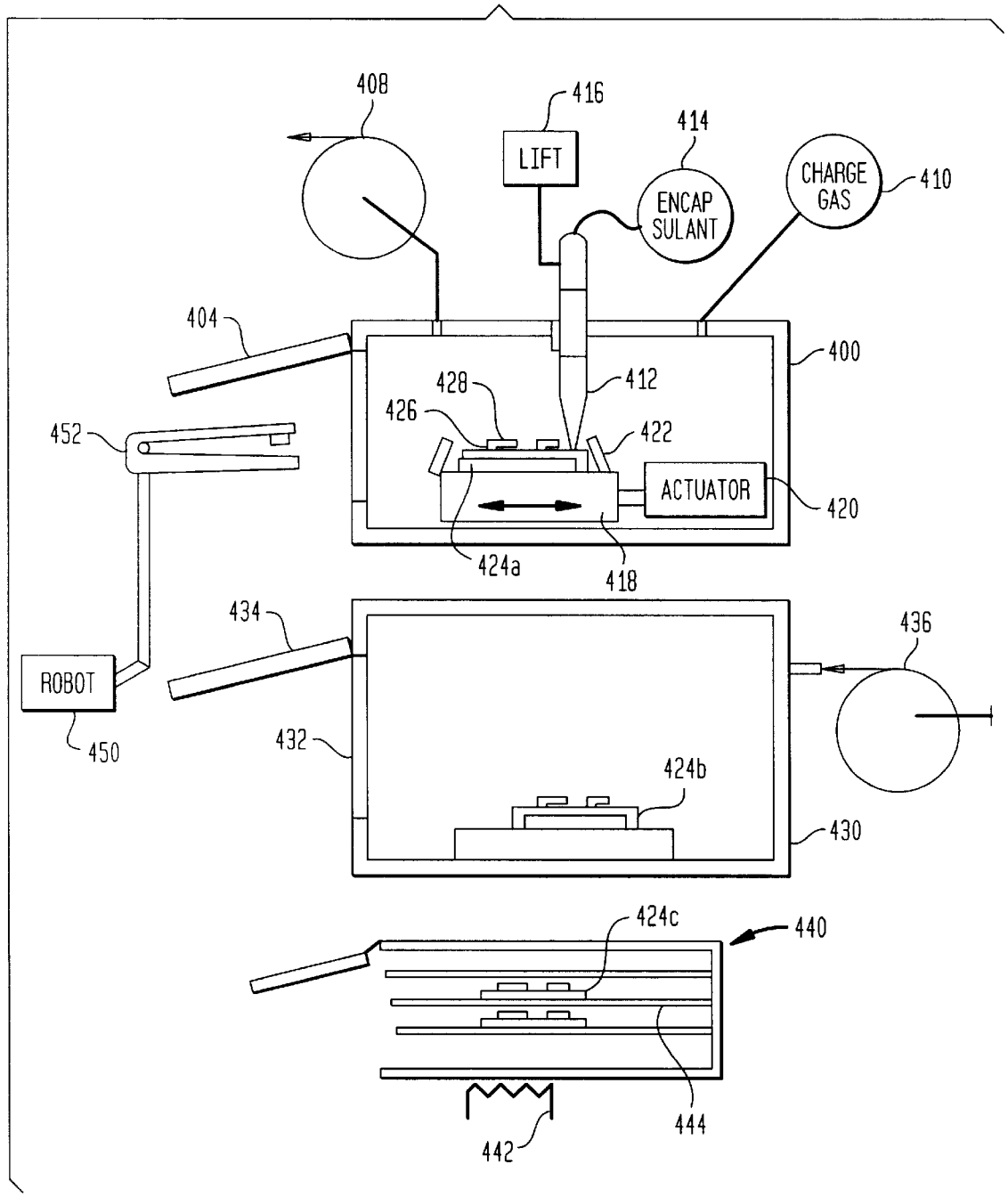
FIG. 7 is a diagrammatic view depicting apparatus and a process in accordance with further embodiments of the invention.

The apparatus of FIG. 7 further includes a separate pressure chamber 430 having a port 432 and sealing door 434. The pressure chamber is connected to a pressure source 436 such as a conventional air compressor 436, which is equipped with conventional control devices. A conventional oven 440 of the type commonly used for elevated-temperature treatment of semiconductor assemblies and packages. This oven is equipped with a heating device 442.

A set of racks 444 is disposed within oven 440. The racks are arranged to hold frames 424. For example, the frames and racks may be as shown in copending, commonly assigned U.S. Provisional Patent Application No. 60/040,020, the disclosure of which is incorporated by reference herein.

A conveying device such as a robot 450 equipped with a grip 452 adapted to engage frames 424 is also provided. The robot has a range of motion sufficient to allow it to place frames into and out of the vacuum chamber 400, pressure chamber 430 and oven 440.

In a process according to a further embodiment of the invention, the robot is actuated to move each frame in a series of frames into the vacuum chamber; then out of the vacuum chamber into the pressure chamber; then into the oven and finally out of the oven. While each frame is in the vacuum chamber, the encapsulant is applied in the manner discussed above while the microelectronic element or chip and substrate are maintained under subatmospheric pressure. However, nozzle 412 remains in fixed position during the encapsulant application step. Stage 418, and hence the assemblies of microelectronic elements and substrates, move with respect to the chamber, whereas nozzle 412 remains stationary. Once again, a charging gas from source 410 may optionally be employed as the gas present at subatmospheric pressure during the encapsulant application step. After application of the encapsulant, the chamber 400 is brought to atmospheric pressure, and the assembly is transferred by the robot into the pressure chamber 430. After encapsulant has been applied to the assemblies on a frame disposed within the vacuum chamber, and after an appropriate equilibration period to allow the encapsulant to flow in the manner described above, the chamber is brought to atmospheric pressure, door 404 is opened and robot 450 removes the frame. The robot transfers the frame to pressure chamber 430, where the frame and assemblies are held at a superatmospheric pressure for a dwell time sufficient to substantially eliminate gas bubbles from within the encapsulant. After this dwell time, the frame is transferred to oven 440.

As shown in FIG. 7, several frames and the assemblies thereon are being processed simultaneously. Thus, while frame 424a and the assemblies thereon is being encapsulated in vacuum chamber 400, frame 424b is being subjected to the dwell time under superatmospheric pressure whereas several frames 424c are being baked in oven 440. Because oven 440 can operate at atmospheric pressure, a large, conventional oven can be employed. The racks within the oven can be arranged to accommodate numerous frames, so that many assemblies can be cured simultaneously. This allows the system to have a large throughput even where a relatively long curing time is required. Also, because separate vacuum and pressure chambers are employed, the capacities of these elements can be varied to accommodate differing operation speeds. For example, where a very long dwell time at superatmospheric pressure is required, several pressure chambers 430 can be employed. Conversely, if the operations performed in the vacuum chamber take longer than the operations performed in the pressure chamber, several vacuum chambers, or a larger vacuum chamber equipped with several dispensing nozzles, can be employed. The robot conveyer depicted in FIG. 7 is merely exemplary. Other conventional types of conveying systems, such as belt or chain conveyors, can be employed. Also, partially manual handling devices such as carts with racks thereon can be employed for moving assemblies between the chambers and from the pressure chamber to the oven.

A similar approach, using separate vacuum and pressure chambers and a separate curing oven can be employed where the assemblies are mounted on a continuous tape, as discussed above in connection with FIG. 6.

Figure 8:
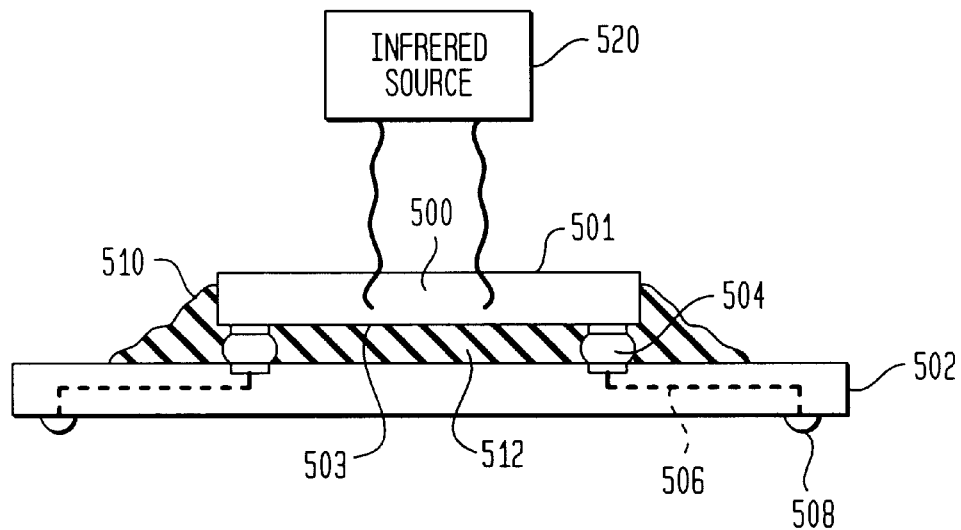
FIG. 8 is a diagrammatic view of an assembly during a process step in accordance with a further embodiment of the invention.

Encapsulation processes according to the present invention can be employed with rigid substrates, as well as with the flexible substrates discussed above. The assembly depicted in FIG. 8 incorporates a semiconductor chip 500 mounted on a rigid substrate such as a ceramic substrate 502 by solder balls 504 in a "flip-chip" configuration. Thus, a first surface 501 of chip 500 faces upwardly, away from substrate 502, whereas a second surface 503 faces downwardly, towards the substrate. In the particular assembly illustrated, the substrate itself incorporates internal electrical connectors 506 and terminals 508 for making further connections with an additional circuit panel (not shown) during use of the assembly. However, other substrates, such as large, continuous circuit boards may also be employed. Here again, the encapsulant 510 may be applied around the periphery of the microelectronic element or chip 500 while the assembly is maintained under subatmospheric pressure. The encapsulant is allowed to flow into the gap 512 between the chip and substrate. This leaves a part of the encapsulant disposed in the gap, at the second surface 503 of the chip.

This portion of the encapsulant may be heated and cured by directing infrared radiation from a conventional infrared radiation source 520, such as a lamp or laser. The infrared radiation passes through the chip, from first surface 501 to second surface 503 and out from second surface 503 into the encapsulant at the second surface. This allows rapid heating of the encapsulant underlying the chip. This approach can be used in conjunction with conventional heating in an oven, or in lieu thereof. Also, the infrared radiation can induce cure by mechanisms other than direct heating. The silicon of the chip is substantially transparent to radiation in the wavelength bands utilized by light source 520. Depending upon the nature of the chip, it may incorporate features such as metallic traces internal to the chip which are opaque to the applied radiation. However, these typically do not occupy the entire area of the chip, so that at least some regions of the chip are translucent or transparent to the infrared radiation. Transmission of radiation through the chip can be used to treat materials other than encapsulants disposed beneath a semiconductor chip. For example, infrared radiation can be applied through the chip to melt or debond an adhesive bonding a chip to a circuit panel. Conversely, infrared radiation applied through the chip may be used to cure a die attach adhesive, or may activate bonding materials such as solders. Appropriate lenses (not shown) may be used to focus the infrared radiation to a point or line at the desired location beneath the chip. It is not essential that the material to be treated, be in physical contact with the second surface 503. Also, the infrared curing approach can be used in conjunction with assemblies incorporating flexible substrates, such as those discussed above.

Figure 9:
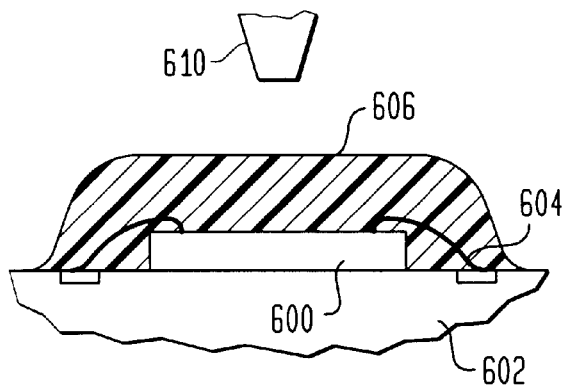
FIGS. 9 and 10 are fragmentary diagrammatic sectional views depicting assemblies in accordance with further embodiments of the invention.
Figure 10:
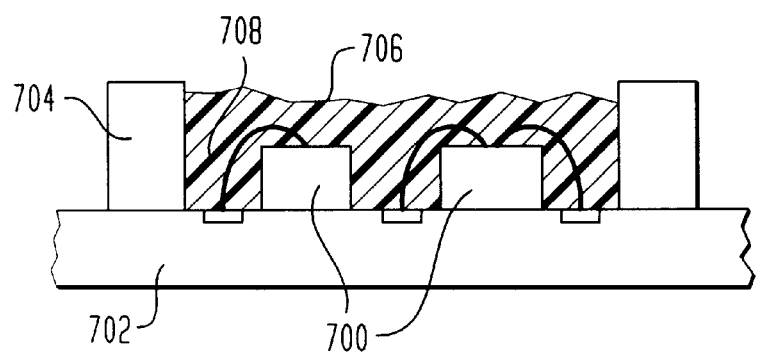

The present encapsulation processes can be utilized in conjunction with assemblies which do not incorporate a gap. For example, as shown in FIG. 9, a "glob-top" package includes a microelectronic element such as a semiconductor chip, discrete component, or other electronic device 600 disposed on a substrate such as a circuit panel 602 and electrically connected thereto, as by leads 604. A mass of encapsulant 606 is applied over the microelectronic element 600 and substrate so as to form a "glob" overlying the microelectronic elements and leads. Although the encapsulant does not penetrate between the chip and substrate, gas bubbles can still be entrapped in the encapsulant as, for example, in interstices beneath the leads or in other corners and relatively inaccessible spots. Application of subatmospheric pressure during application of the encapsulant and subsequent exposure to a higher pressure such as an atmospheric or superatmospheric pressure will relieve the problems caused by such words. In this application, the encapsulant can be applied in a single location and allowed to flow into position. A nozzle 610 disposed above the middle of the assembly may be used to discharge a measured quantity of encapsulant and the encapsulant may be allowed to flow while the assembly is disposed subatmospheric pressure.

The encapsulation procedures according to the invention can also be used with a "dam and fill" assembly as depicted in FIG. 9. Such an assembly includes one or more microelectronic devices 700 disposed on a substrate 702. The devices are disposed within a ring-like barrier or "dam" 704. Encapsulant 706 is dispensed into the interior of this barrier so as to cover the microelectronic devices. Here again, voids such as void 708 may form during encapsulant application. Application of subatmospheric pressure during encapsulant application, and subsequent exposure to a higher pressure, minimizes or eliminates voids in this type of assembly as well.

The encapsulants used in the various assemblies may be varied considerably. For example, some assemblies of rigid components can be fabricated using a rigid encapsulant, where compliancy is not desired. Also, in a glob-top or dam fill assembly, a rigid encapsulant may be desirable to provide additional mechanical protection to the device.

As these and other variations and combinations of the features discussed above can be utilized without departing from the invention as defined by the claims, the foregoing description of the preferred embodiments should be taken by way of illustration rather than by way of limitation of the invention as defined by the claims.

What is claimed is:

1. Apparatus for encapsulating microelectronic elements comprising:
   (a) a chamber;
   (b) a dispenser including a source of an encapsulant and a nozzle disposed within the chamber so that the dispenser can apply encapsulant to one or more semiconductor assemblies disposed within the chamber;
   (c) means for maintaining the chamber under a subatmospheric pressure while the dispenser applies encapsulant to semiconductor assemblies.

2. Apparatus as claimed in claim 1 further comprising means for moving the nozzle relative to one or more microelectronic assemblies disposed within the chamber.

3. Apparatus as claimed in claim 2 wherein said means for moving includes means for moving the nozzle relative to the chamber.

4. Apparatus as claimed in claim 2 wherein said means for moving includes means for moving the microelectronic assemblies relative to the chamber.

5. Apparatus as claimed in claim 2 wherein said means for moving is operative to move the nozzle along edges of microelectronic elements incorporated in said one or more microelectronic assemblies.

6. Apparatus as claimed in claim 1 further comprising a vacuum chuck for holding microelectronic assemblies, said vacuum chuck having a holding surface and suction passages opening to said holding surface, the apparatus further comprising suction source for maintaining a holding pressure less than said subatmospheric pressure in said suction passages to thereby hold microelectronic elements against said holding surface under the influence of said subatmospheric pressure.

7. Apparatus as claimed in claim 1 further comprising means for advancing microelectronic assemblies into said chamber and removing microelectronic assemblies from said chamber.

8. Apparatus as claimed in claim 1 further comprising means for applying a superatmospheric pressure in said chamber after application of said subatmospheric pressure.

9. Apparatus as claimed in claim 1 further comprising a pressure vessel, means for applying a superatmospheric pressure in said pressure vessel and means for transferring microelectronic assemblies from said chamber to said pressure vessel.

* * * * *

UNITED STATES PATENT AND TRADEMARK OFFICE
CERTIFICATE OF CORRECTION

PATENT NO. : 6,126,428
DATED : October 3, 2000
INVENTOR(S) : Mitchell et al.

It is certified that error appears in the above-identified patent and that said Letters Patent is hereby corrected as shown below:

Column 1, line 9, after "and" insert --which--.

Column 8, line 17, delete "0".

Signed and Sealed this

Eighth Day of May, 2001

Attest:

NICHOLAS P. GODICI

*Attesting Officer*   *Acting Director of the United States Patent and Trademark Office*